United States Patent [19]

O'Donnell et al.

[11] Patent Number: 4,680,551
[45] Date of Patent: Jul. 14, 1987

[54] METHOD FOR HOMOGENIZING A STATIC MAGNETIC FIELD OVER AN ARBITRARY VOLUME

[75] Inventors: Matthew O'Donnell, Schenectady; Steven G. Karr, Scotia; William D. Barber, Ballston Lake, all of N.Y.; Jish M. Wang, East Brunswick, N.J.; William A. Edelstein, Schenectady, N.Y.

[73] Assignee: General Electric Company, Schenectady, N.Y.

[21] Appl. No.: 785,140

[22] Filed: Oct. 7, 1985

[51] Int. Cl.$^4$ .................................. G01R 33/20
[52] U.S. Cl. .................................. 324/320; 324/318
[58] Field of Search .................. 324/318, 309, 320; 335/216, 229, 209, 299

[56] References Cited

U.S. PATENT DOCUMENTS 4,523,166  6/1985  Gross .................................. 324/320
4,581,580  4/1986  Keim .................................. 324/320

OTHER PUBLICATIONS

Current Shims for High-Resolution NMR on Correcting Field Inhomogeneities, I. Zupancic Nuclear Ins. J. Stefan Ljubljana Yugo, Apr./1962.
Electrical Current Shims for Correcting Mag. Fields, W. Anderson, Review of Scientific Instruments, vol. 32, No. 3, Mar./1961.

Primary Examiner—Stewart J. Levy
Assistant Examiner—Louis M. Arana
Attorney, Agent, or Firm—Geoffrey H. Krauss; James C. Davis, Jr.; Marvin Snyder

[57] ABSTRACT

A method for minimizing the inhomogeneity of a static magnetic field, produced by a main magnet, over a selected arbitrary volume, by operation of a plurality N of shimming coils each independently producing an associated shimming magnetic field having an associated inhomogeneity which is a function of spatial location over that same volume, uses the steps of: measuring the magnitude of the main magnet field, in the absence of all shimming fields, at a plurality of locations $X_i$ upon the surface of an imaginary sphere enclosing the arbitrary volume; measuring the polarity and magnitude of each of the N shimming fields, with respect to the polarity and magnitude of a D.C. current flowing through the associated shimming coil, at the same plurality of locations $X_i$ upon the imaginary sphere surface; determining the weighted mean-square variation of the total field at each of another plurality of points $Y_i$ within the volume of said imaginary sphere; and (d) selecting the current magnitudes and polarities for each of the N shimming coils to provide each of the N associated shimming fields with magnitude and polarity to minimize the inhomogeneity of the main magnetic field in the arbitrary volume. The set of weighting coefficients may be selected to all be equal, or to emphasize at least one desired region of the arbitrary volume.

14 Claims, 2 Drawing Figures

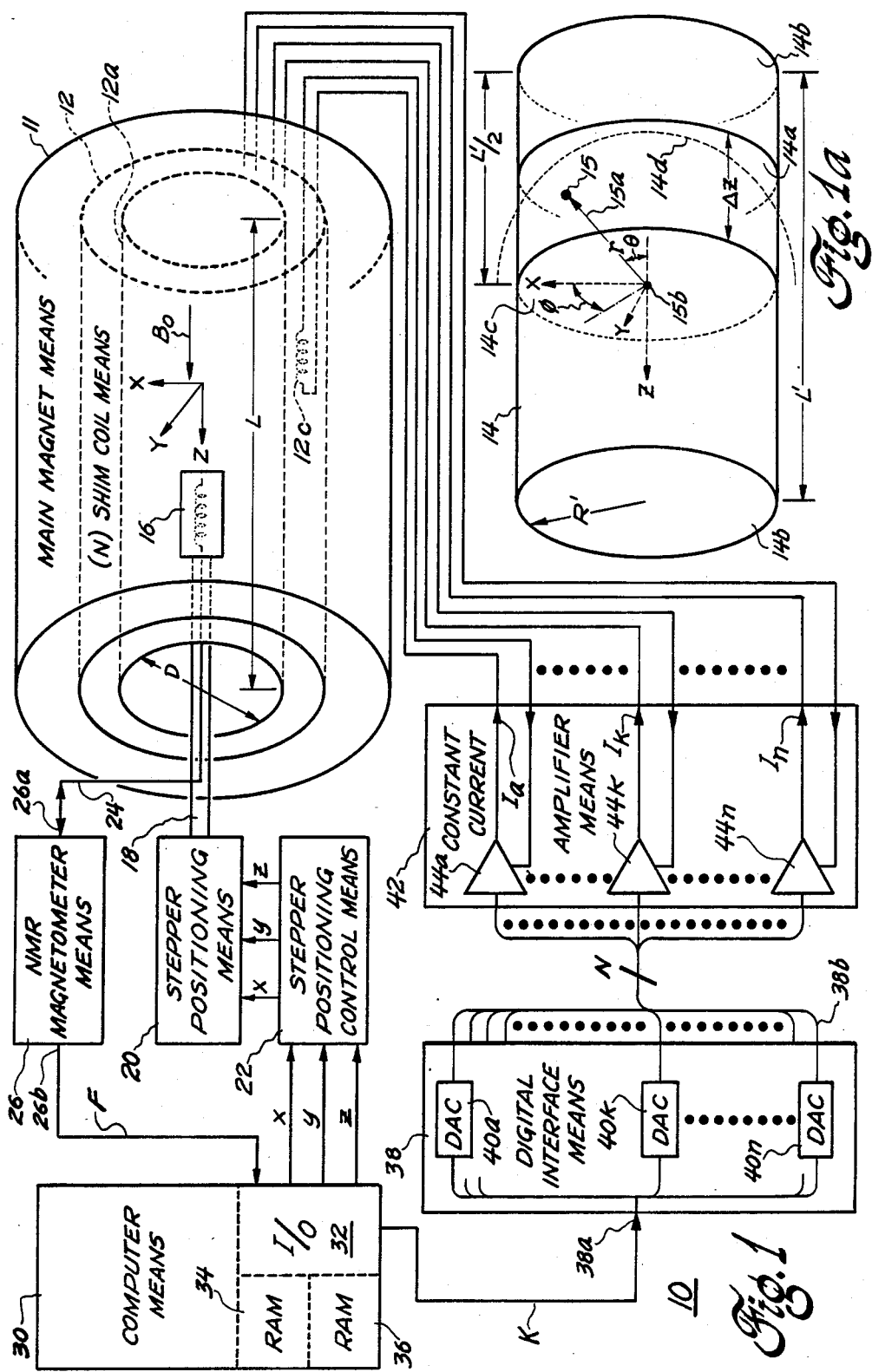

METHOD FOR HOMOGENIZING A STATIC MAGNETIC FIELD OVER AN ARBITRARY VOLUME

BACKGROUND OF THE INVENTION

The present invention relates to highly uniform magnetic fields, such as for nuclear magnetic resonance (NMR) imaging and the like, and, more particularly, to a novel method for homogenizing a static magnetic field over an arbitrary volume, by the use of electrical shimming coils to provide correction fields of magnitude determined by a single measurement of that static magnetic field over the surface of a sphere encompassing all of the volumes of interest.

It is well known that a static magnetic field is often required to have an essentially constant magnitude over a certain volume, as, for example, the main static magnetic field utilized in NMR imaging. In such usage, it is known that the Larmor, or resonance, frequency $\omega$, for a particular nuclear species, is given by the formula $\omega = \gamma B_O$, where $\gamma$ is the gyromagnetic ratio for that nuclear species and $B_O$ is the total magnetic field magnitude to which a nucleus is exposed at its particular location. The amplitude of the response resonance signal is determined by the density of nuclei; the actual locations of the nuclei are encoded into the response signals by impressing a set of essentially linearly-varying magnetic field gradients upon the total main static magnetic field such that the resonance frequency of nuclei at different locations is different. The resulting amplitude-frequency characteristic of the response signal is Fourier-transformed and displayed to provide a density versus location display of the desired nuclear species. In order to obtain proper location information, it is required that the static magnetic field be as homogenized as possible, i.e. have as little divergence from a constant value as possible over the volume in which the measurements of the sample are taking place. For this purpose, a typical magnet, for use in NMR and the like, will have a main magnet coil (which may be of resistive or superconducting nature) and will have some number N of shim coils, each of which provides a smaller-magnitude correction field over at least a part of the volume in which the field of the main magnet occurs. The inhomogeneities in the field can be characterized by a mathematical expression containing a series of terms which depend on higher and higher powers of the linear and angular coordinates. The simplest conceptual arrangement would be to have each shim winding affect only one term. In practice, each shim coil affects multiple terms of the expansion. Because of these interrelationships of the several shimming fields, it is relatively difficult to provide minimum inhomogeneity of the static field. For example, in one particular main magnet of resistive design for providing a 0.15 tesla (T) field within a cylinder of 20 cm. length and radius, the resulting inhomogeneities (after original shimming in an attempt to minimize variations in the magnetic field over the surface of a sphere, of about 45 cm. diameter, encompassing the desired imaging volume) produced the following results; for various planes measured at some distance $\Delta Z$ from the central plane of the imaging plane:

| $\Delta Z$ | ±0 cm | ±2 cm | ±4 cm | ±6 cm | ±8 cm | ±10 cm |
|---|---|---|---|---|---|---|
| homogeneity | 50 ppm | 91 ppm | 180 ppm | 213 ppm | 263 ppm | 300 ppm |

It will be seen that if, for the above example, a particular experiment requires an inhomogeneity of no greater than ±50 ppm., then there is practically no volume over which to image the sample. Accordingly, a method for shimming the static magnetic field over some arbitrary volume, to within some maximum degree of inhomogeneity, is highly desirable.

BRIEF DESCRIPTION OF THE INVENTION

In accordance with the invention, a method for minimizing the inhomogeneity of a static magnetic field, produced by a main magnet means, over a selected arbitrary volume, by operation of a plurality N of shimming coils each independently producing an associated shimming magnetic field over that same volume, comprises the steps of: (a) measuring the magnitude of the main magnet field, in the absence of all shimming fields, at a plurality of locations $X_i$ upon the surface of an imaginary sphere enclosing the arbitrary volume; (b) measuring the polarity and magnitude of each of the N shimming fields, with respect to the polarity and magnitude of a D.C. current flowing through the associated shimming coil, at the same plurality of locations $X_i$ upon the imaginary sphere surface; (c) determining the weighted mean-square variation of the total field at each of another plurality of points $Y_i$ within the volume of said imaginary sphere; and (d) selecting the current magnitudes and polarities for each of the N shimming coils to provide each of the N associated shimming fields with magnitude and polarity to minimize the inhomogeneity of the main magnetic field in the arbitrary volume. The set of weighting coefficients may be selected to all be equal, or to emphasize at least one desired region of the arbitrary volume.

In a presently preferred embodiment, the N simultaneous equations of the errors terms at locations $Y_i$ are formed into an error matrix, which is inverted (by use of a computer program, for speed) to provide the unique set of coil currents to realize the required magnitude and polarity for each of the N shimming fields.

Accordingly, it is an object of the present invention to provide a novel method for homogenizing a static magnetic field over an arbitrary volume.

This and other objects of the present invention will become apparent upon reading of the following detailed description of the invention, when considered in conjunction with the figures.

BRIEF DESCRIPTION OF THE DRAWINGS

FIG. 1 is a schematic block diagram of portions of a NMR imaging system, in which a system static magnetic field is to be homogenized, and of the additional means utilized with the system for static field homogenization; and FIG. 1a is a diagram of the imaging volume of the main magnet of FIG. 1, illustrating the various locations, angles and planes discussed in the following detailed description.

DETAILED DESCRIPTION OF THE INVENTION

Referring to the drawings, a system 10, such as a nuclear magnetic resonance (NMR) imaging system and the like, has a main magnet means 11, providing a static magnetic field $B_O$. The main magnet means 11 may be of resistive or superconductive nature, to produce a static magnetic field magnitude $B_O$ of a desired amplitude, e.g. 0.15 tesla(T). Main field $B_O$ is to be homogenized (i.e. to have the mean square variations of the total field minimized, over an arbitrary volume) by operation of at least one, and generally N, shimming magnetic fields. The main magnetic field and each of the shimming fields is provided in at least an imaging volume located within that larger total volume required for the main magnet means 11 and the N associated shim coil means 12 for providing the N shim fields. Illustratively, the shim coil interior volume is cylindrical, as defined by a free bore cylindrical surface 12a, having a diameter D and a length L. Shim coil means 12 is comprised of N shim coil means 12c each capable of providing the associated shimming field within the cylindrical volume 12a, responsive to the magnitude of an associated shimming coil current $I_n$ flowing therethrough. Within the free bore volume, an imaging volume 14, generally of cylindrical nature for a NMR system to be utilized for providing images of at least portions of the human anatomy, can be defined with an imaging volume radius R' (less than the free bore radius D/2) and an imaging volume length L' (less than free bore length L). A plane 14a, typically orthogonal to the central axis of the cylinder (which is often made coincident with the Z axis of a Cartesian coordinate system) is, in general, parallel to the pair of imaging volume parallel end planes 14b, and is at a distance $\Delta Z$ from a central plane 14c of the imaging volume, located at a distance L'/2 from each of the end planes 14b. We desire to minimize the error in the static field within an arbitrary portion of volume 14. The Cartesian (X, Y, Z) system will advantageously be transmutated to a spherical coordinate system: a point 15 in the imaging volume 14 is thus at a radial distance, represented by a position vector 15a, from a volume center 15b; vector 15a is projected to the X-Y plane to provide an angle $\Phi$ with the X-Z plane; and a second angle $\theta$ is formed by radius vector 15a with the Z axis.

In accordance with the invention, the magnitude of the main magnet total field $B_M$ (to be homogenized within a spherical imaging volume 14d) is first measured at a number of points $X_i$ on the surface of sphere 14d in the absence of all shimming fields. Each of the shim coil means shimming fields $B_j$ (for $1 \leq j \leq N$) is then measured at the same points $X_i$ on the same surface, and with respect to the constant current $I_j$ producing that field in the absence of all other magnetic fields. The measurement of magnetic field magnitude and direction (polarity) is carried out utilizing a field probe means 16 which is mounted upon a non-magnetic member 18. Member 18, and therefore probe 16, is moved in three-dimensional space by a stepper positioning means 20. The stepper positioning means 20 receives a set of x, y and z location signals from a stepper positioning control means 22, such that field probe 16 is positioned at each of a set of Cartesian coordinate locations upon the surface of that imaginary sphere 14d required for minimization of the inhomogeneities of the static magnetic field $B_O$ to result at the end of the homogenization procedure. The x, y and z position information (calculated from the associated r, $\theta$, $\Phi$ position information) is provided by a computer means 30, such as the NMR system computer means, via an input/output I/O portion 32 thereof. The computer means may store the probe-measured field information in random-access memory (RAM) means 34 thereof, for each (x, y, z) or (r, $\theta$, $\Phi$) position requested by a homogenization program. The program itself may be stored in a read-only (ROM) means 36 associated with the computer. The field information for a particular location is provided by measuring the NMR resonance frequency at that location, as the frequency will be a function of the total magnetic field magnitude to which a nucleus of a particular nuclear species is exposed at that location. The resonance signal is provided via a cable 24 to the input 26a of a NMR magnetometer means 26. The magnetometer means, such as a Sentec model 1001 and the like, analyzes the signal at input 26a, to provide a data signal F, at the output 26b thereof, digitizing the magnitude of the magnetic field $B_O$ at the particular measurement location. Information as to the field magnitude F for a particular location ($X_i = (x_i, y_i, z_i)$ or $X_i = (r_i, \theta_i, \Phi_i)$) is thus made available via I/O portion 32 and is stored at an associated address within RAM memory 34, under control of computer 30.

When the magnetic field $B_j$ contributions of each of the shim coil 12c are to be measured, computer means 30, via I/O portion 32, provides a K-bit digital data signal to the digital inputs 38a of a digital interface means 38. Digital interface means 38 contains a plurality N of digital-to-analog converter (DAC) means 40. Several of the signals on the K digital input lines determine which one of the N different and independently DAC means is to be provided with the remainder of the digital data line bits to determine the polarity and amplitude of an analog signal at the particular DAC means output. Thus, at any particular instant, the computer means may select the k-th DAC means $40k$ (where $a \leq k \leq n$), to provide an analog signal at the associated k-th one of N interface means outputs 38b. This associated analog signal appears on a dedicated one of the N analog signal output lines from digital interface means 38 to the associated one of the N inputs of a constant current amplifier means 42. Constant current amplifier means 42 contains a plurality N of constant current amplifiers 44. Each amplifier means $44k$ provides a constant current $I_k$ of polarity and amplitude determined by the associated analog signal from the associated DAC means $40k$ of the digital interface means. Means 38-42 are normally a part of the shimming portion of an NMR system.

The main magnet field $B_M$ is separated into the essentially-constant main field portion $B_O$ and an error magnetic field portion $\Delta B_M$, which can be expanded in solid spherical harmonics terms, so that $$B_M(X_i) = B_o + \Delta B_M(X_i) \tag{1}$$

with $\Delta B_M(X_i)$ given by $$\Delta B_M(X_i) = \Sigma_n \Sigma_m r_i^n P_n^m (\cos \theta_i)[A_{nO}^m \cos (m\Phi_i) + B_{nO}^m \sin (m\Phi_i)] \tag{2}$$

where $X_i = (r_i, \theta_i, \Phi_i)$ and the $P_n^m$ terms are the associated Legendre functions. The constants $A_{nO}^m + B_{nO}^m$ can be evaluated by measuring the magnetic field at a set of points $X_i$ positioned over the surface of the sphere at the zeros of the Legendre function $P_{n+1}^O (\cos \theta)$. In theory, the expansion must retain terms for all n and m. In practice, an upper bound on n and m are chosen to limit the difficulty of calculation but still retain all important components present in the shim coil set. For our application, expansions up to n=13, m=2 are retained.

The shimming field produced by each of the N shim coils can be expanded in the same fashion as the expansion of the error terms of the main magnet field, such that the field produced, per ampere of current $I_j$, for the j-th shimming coil, is:

$$B_j(X_i) = \Sigma_n \Sigma_m r_i^n P_n^m(\cos\theta_i)[A_{nj}^m \cos(m\Phi_i) + B_{nj}^m \sin(m\Phi_i)] \quad (3)$$

It will be seen that the total field $B_T$ is thus equal to $$B_T(X_i) = B_O + \Delta B_M(X_i) + \sum_{j=1}^{N} B_j(X_i) \quad (4)$$

or, for the total static field $B_T$ to be essentially equal to the homogenized portion $B_O$, the mean square variations in the field should be optimally minimized after the main magnet and each of the shim coils have been individually characterized over the sphere of interest. That is, if $(Y_i) i = 1, \ldots, N$ represents a set of points within the volume of the sample sphere of interest, then the mean-square error E to be minimized, in the magnetic field in this volume, is $$E = \sum_{i=1}^{V} W_i \left( \Delta B_M(Y_i) - \sum_{j=1}^{N} I_j B_j(Y_i) \right)^2 \quad (5)$$

for N shimming coils and V homogenizing points in the volume, where $I_j$ is the current in the j-th shim coil and $W_i$ is a weighting factor attached to the i-th volume point. The set of points, $(Y_i) i = 1, \ldots, N$, can be chosen for a given application to assure that the optimum field uniformity is obtained for that application. For a uniformly minimized error field throughout the entire arbitrary volume, the weighting functions $W_i$ are all equal to 1. Thus, the currents needed to homogenize the field over the volume of interest are obtained by minimizing this mean-square error E term, with respect to each of the coil currents $I_j$. This yields a set of N simultaneous equations, with N unknown shim coil currents $I_n$; the simultaneous equations can be solved by utilizing matrix algebra. Advantageously, a rapid solution can be obtained by use of the system computer means 30 and an appropriate program, such as the matrix inversion Fortran routine MTINV, available as product number AES 0019 from the TSO Applications Library, Volume 1-Mathematics, series 60 (level 66)/6000 (June 1971 release date), from Honeywell and the like. Any such program will solve for the shimming coil current vector I as $I = A^{-1}C$, where $A_{KL} = \Sigma_i W_i(B_K(Y_i)B_L(Y_i))$ and $C_K = \Sigma_i W_i(\Delta B_M(Y_i)B_K(Y_i))$, such that for each set of positions $Y_i$ (i.e. for each new imaging volume), there is a unique set of shim currents $I_j$ to homogenize that volume.

Illustratively, after use of the above procedure in the volume of the 45 cm. diameter arbitrary sphere of the previous measurements, the reshimmed inhomogeneities were reduced to:

| $\Delta Z$ | ±0 cm | ±2 cm | ±4 cm | ±6 cm | ±8 cm | ±10 cm |
|---|---|---|---|---|---|---|
| reshimmed homogeneity | 44 ppm | 45 ppm | 55 ppm | 72 ppm | 103 ppm | 140 ppm |
| original homogeneity | 50 ppm | 91 ppm | 180 ppm | 213 ppm | 263 ppm | 330 ppm |
| % improvement | 12% | 50% | 69% | 66% | 61% | 58% |

It will be seen that, for the previous example wherein a particular experiment requires an inhomogeneity of no greater than ±50 ppm., there is now a practical volume over which to image the sample.

Our novel method for shimming the static magnetic field of a magnet to minimize the inhomogeneity over some arbitrary volume, by adjustment of the effective field of each of a plurality of shimming magnetic fields, has been explained with respect to one presently preferred embodiment thereof. Many variations and modifications will now become apparent to those skilled in the art. It is our intent, therefore, to be limited only by the scope of the appending claims and not by the specific details and instrumentalities presented by way of explanation of the preferred embodiment.

What is claimed is:

1. A method for minimizing the inhomogeneity of a static magnetic field, produced by a main magnet means, over a selected arbitrary volume, by operation of a plurality N of shimming coil means each independently an associated shimming magnetic field over that same volume, comprising the steps of:

(a) measuring the magnitude of the main magnet static field, in the absence of all shimming fields, at a plurality of locations $X_i$ upon the surface of an imaginary sphere defined to enclose the arbitrary volume;

(b) measuring the magnitude and polarity of each of the N shimming fields, with respect to the magnitude and polarity of a DC current flowing through the associated shimming coil means, at the same plurality of locations $X_i$ upon the imaginary sphere surface;

(c) determining the weighted mean-square error E of the total field, to the homogeneous field, at each of another plurality of points $Y_i$ within the volume of said imaginary sphere; and (d) selecting the magnitude and polarity of each current flowing through an associated one of the N shimming coils means to provide each of the N associated shimming fields with a magnitude and a polarity acting to substantially minimize the error E and the inhomogeneity of the main magnet field in the arbitrary volume.

2. The method of claim 1, wherein step (c) includes the step of selecting all of the weighting coefficients, utilized in determining the weighted mean-square error of the total field, to be equal.

3. The method of claim 1, wherein step (a) further comprises the step of selecting the arbitrary volume to be a cylindrical volume having a preselected radius R' and a preselected length L'.

4. The method of claim 3, wherein step (a) further comprises the step of selecting the imaginary sphere to have a diameter D greater than 2R'.

5. The method of claim 1, wherein step (a) further comprises the step of locating each point $X_i$, where $X_i = (r_i, \theta_i, \Phi_i)$, at a zero of an associated Legendre function $P_{n+1}^m(\cos\theta_i)$.

6. The method of claim 5, wherein step (a) further comprises the step of setting the associated Legendre function indices m and n to retain in step (b) all non-negligible components produced by the N shimming coils.

7. The method of claim 6, wherein step (a) includes the step of locating each point $X_i$ at a zero of the associated Legendre function $P_{n+1}^0(\cos \theta_i)$.

8. The method of claim 1, wherein step (b) includes the step of characterizing each shimming field $B_j$, where $1 \leq j \leq n$, at a plurality of magnitudes of the associated shimming coil current $I_j$.

9. The method of claim 8, wherein step (a) further comprises the step of locating each point $X_i$, where $X_i = (r_i, \theta_i, \Phi_i)$, at a zero of an associated Legendre function $P_{n+1}^m(\cos \theta_i)$.

10. The method of claim 9, wherein step (a) further comprises the step of setting the associated Legendre function indices m and n to retain in step (b) all non-negligible components produced by the N shimming coils.

11. The method of claim 10, wherein step (a) includes the step of locating each point $X_i$ at a zero of the associated Legendre function $P_{n+1}^0(\cos \theta_i)$.

12. The method of claim 1, wherein step (d) includes the step of solving N equations, by matrix inversion, to determine a vector of the required N shimming-field-forming currents.

13. The method of claim 12, further comprising the steps of: determining the shimming currents for minimization of errors in each of a plurality of different arbitrary volumes; storing the shimming current vectors for each of the plurality of arbitrary volumes; retrieving the shimming current vectors for a selected one of the plurality of arbitrary volumes; and causing each of the shimming currents to assume the value thereof in the selected matrix to provide the minimized inhomogeneity main magnet field in the associated selected volume.

14. The method of claim 13, further comprising the step of providing automatic means, normally associated with the main magnet and the plurality of shimming coil means in a system, for automatically establishing the required magnitude and polarity of each of the N shimming current flows to substantially homogenize the main magnet field for any selected one of the plurality of different arbitrary volumes.

* * * * *